United States Patent [19]

Gupta

[11] Patent Number: 5,567,648
[45] Date of Patent: Oct. 22, 1996

[54] PROCESS FOR PROVIDING INTERCONNECT BUMPS ON A BONDING PAD BY APPLICATION OF A SHEET OF CONDUCTIVE DISCS

[75] Inventor: Debabrata Gupta, Scottsdale, Ariz.

[73] Assignee: Motorola, Inc., Schaumburg, Ill.

[21] Appl. No.: 552,430

[22] Filed: Nov. 3, 1995

Related U.S. Application Data

[63] Continuation of Ser. No. 297,065, Aug. 29, 1994, abandoned.

[51] Int. Cl.$^6$ .................... H01L 21/283; H01L 21/48
[52] U.S. Cl. .................... 437/183; 228/180.22
[58] Field of Search .................... 437/183; 228/180.22, 228/181, 254, 252, 125, 189, 246, 56.3; 257/775

[56] References Cited

U.S. PATENT DOCUMENTS

| | | | |
|---|---|---|---|
| 3,164,499 | 1/1965 | Kooi | 437/183 |
| 3,614,832 | 10/1971 | Chance et al. | 29/577 |
| 3,621,564 | 11/1971 | Tanaka et al. | 437/183 |
| 3,719,981 | 3/1973 | Steitz | 29/423 |
| 3,750,265 | 8/1973 | Cushman | 29/471.3 |
| 4,503,597 | 3/1985 | Kushima et al. | 29/569 R |
| 4,545,610 | 10/1985 | Lakritz et al. | 29/589 |
| 4,557,411 | 12/1985 | Farquharson | 228/56.3 |
| 4,705,205 | 11/1987 | Allen et al. | 228/180.2 |
| 4,906,823 | 3/1990 | Kushima et al. | 228/245 |
| 4,950,623 | 8/1990 | Dishon | 437/183 |
| 5,029,748 | 7/1991 | Lauterbach et al. | 228/180.1 |
| 5,242,097 | 9/1993 | Socha | 228/56.3 |
| 5,244,143 | 9/1993 | Ference et al. | 228/180.21 |
| 5,251,806 | 10/1993 | Agarwala et al. | 228/180.22 |

FOREIGN PATENT DOCUMENTS

| | | | |
|---|---|---|---|
| 61-198738 | 9/1986 | Japan | 437/183 |
| 63-174337 | 7/1988 | Japan | 437/183 |
| 125429 | 1/1989 | Japan | 437/183 |
| 3156931 | 7/1991 | Japan | 437/183 |

*Primary Examiner*—George Fourson
*Assistant Examiner*—David E. Graybill
*Attorney, Agent, or Firm*—Miriam Jackson; Rennie William Dover

[57] ABSTRACT

A method for forming conductive interconnect bumps, such as solder bumps, on bond pads on a substrate. The method includes conductive discs and a connecting member formed between two adjacent conductive discs. The discs and connecting member are then placed over the bond pads and heat is applied so that the conductive discs and the connecting member combine to form isolated interconnect bumps. A polymer backsheet is used for support.

19 Claims, 3 Drawing Sheets

PROCESS FOR PROVIDING INTERCONNECT BUMPS ON A BONDING PAD BY APPLICATION OF A SHEET OF CONDUCTIVE DISCS

This application is a continuation of prior application Ser. No. 08/297,065, filed 29 Aug. 1994, abandoned.

FIELD OF THE INVENTION

This invention relates, in general, to bonding techniques, and more particularly, to an interconnect bump structure and method for forming the same on a substrate.

BACKGROUND OF THE INVENTION

Land grid array packages with solder bump interconnection, such as over-molded pad array carriers (OMPACs), are becoming increasingly popular. The use of flip chip bonding using solder bumps is also becoming widespread. In both of these technologies, the formation of solder bumps on the substrates or chips is a major concern.

Currently, for OMPAC type packages, solder balls are picked up with a suction plate and then attached by flux onto the substrate. The entire operation is carried out by a robot. As the pick-up and delivery of the balls is not completely repeatable, multiple passes consisting of inspection and re-deposition is required. Moreover, the robotic process is slow and is not conducive to low cost mass production.

Solder bumping of chips and wafers requires elaborate semiconductor fabrication facilities involving masking (photoresist or hard mask), evaporation or plating, as well as ancillary chemical operations. These facilities are highly capital-intensive.

Accordingly, it is highly desirable to have a low-cost method for forming interconnect bumps, such as solder bumps, on substrates that doesn't require the use of expensive robotic equipment and can be performed in a simple and reliable method.

DETAILED DESCRIPTION OF THE DRAWINGS

Figure 1:
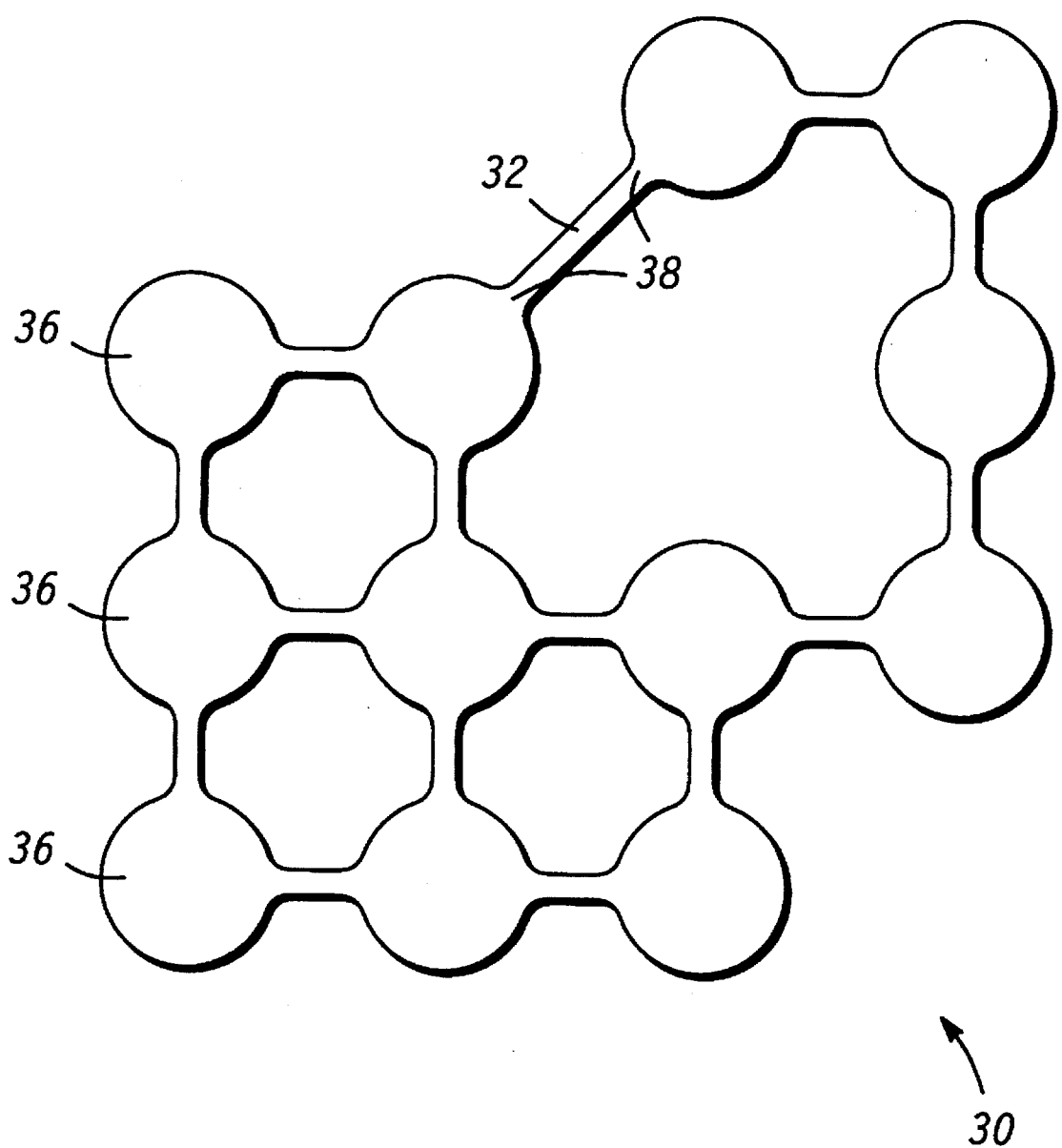
FIG. 1 shows a preform sheet of conductive discs in accordance with the present invention.

FIG. 1 shows a preform sheet 30 comprised of a plurality of conductive discs 36 interconnected by connecting members or ligaments 32 in accordance with the present invention. Preferably, discs 36 and ligaments 32 are comprised of solder, but they may also be comprised of reflowable metal or alloys of gold (Au), indium (In), tin (Sn) or bismuth (Bi), among others. Discs 36 are arranged in a similar configuration as the bond pads on a substrate to which electronic devices are to be electrically coupled.

Preform sheet 30 may be formed by various methods including additive methods, such as plating, and subtractive methods, such as etching. Plating and etching are particularly effective for finer patterns, such as those used for wafer-level bumps. If forming a large volume of preform sheets for an orthogonal bond pad layout, preform sheet 30 may be made from sheets of solder by roll-punching. While the appropriate thickness of preform sheet 30 varies depending on the application, typically, preform sheet 30 has a thickness of approximately 1 to 15 mils (0.025 to 0.375 mm). A polymer backsheet (not shown in FIG. 1) thinly coated with flux may be attached to preform sheet 30 immediately after roll-punching to provide additional resistance from such things as damage due to handling.

Typically, discs 36 are substantially circular in shape and have a diameter of 5 to 40 mils (0.125 to 1.0 nun). The pitch or distance between the centers of two adjacent discs is approximately 10 to 100 mils (0.25 to 2.5 mm).

Ligaments 32 have a length of approximately 0.3 to 0.7 times the diameter of discs 36 and an average width of approximately 0.1 to 0.4 times the diameter of discs 36. Depending on the bond pad layout, the lengths of each ligament 32 in a preform sheet 30 may be different.

In a preferred embodiment, shown in FIG. 1, the width of ligaments 32 at ends 38 is broader than the width of ligaments 32 between ends 38. Making the width of ends 38 broader aids discs 36 in separation during the melting process and prevents ligaments 32 from remaining connected between discs 36 after melting, known as "bridging."

Figure 2:
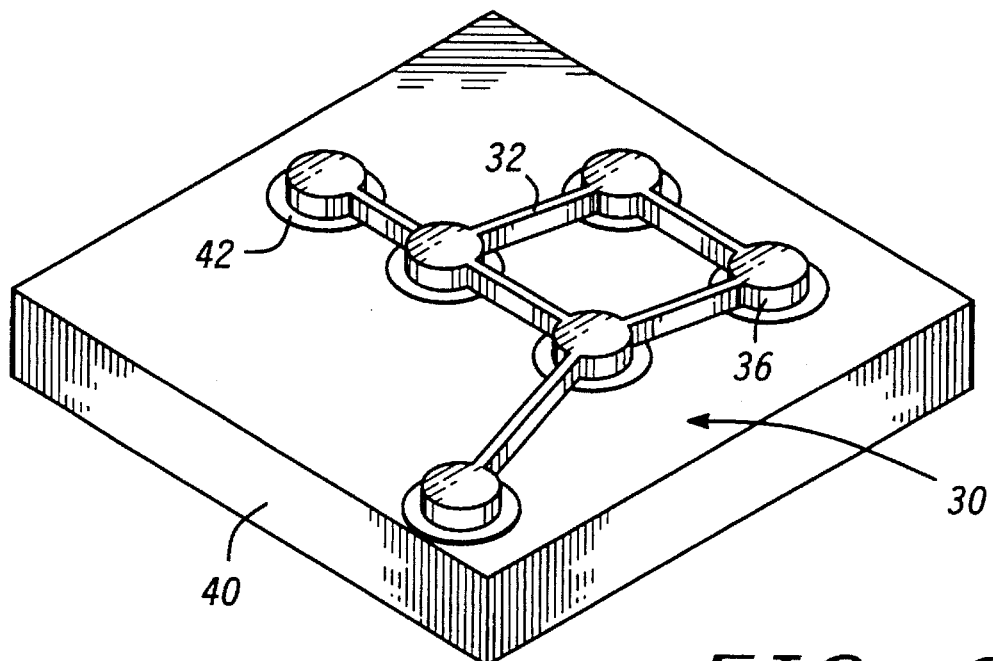
FIG. 2 shows a preform sheet of conductive discs arranged on the bond pads of a substrate in accordance with an embodiment of the present invention.
Figure 3:
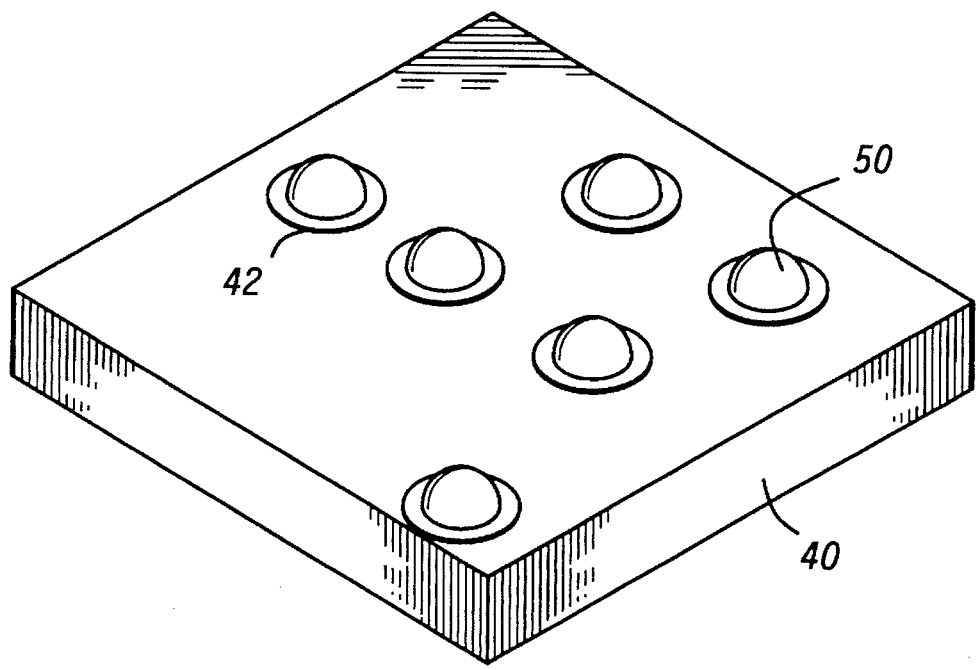
FIG. 3 shows the substrate of FIG. 2 after undergoing a heating process in accordance with the present invention.
Figure 4:
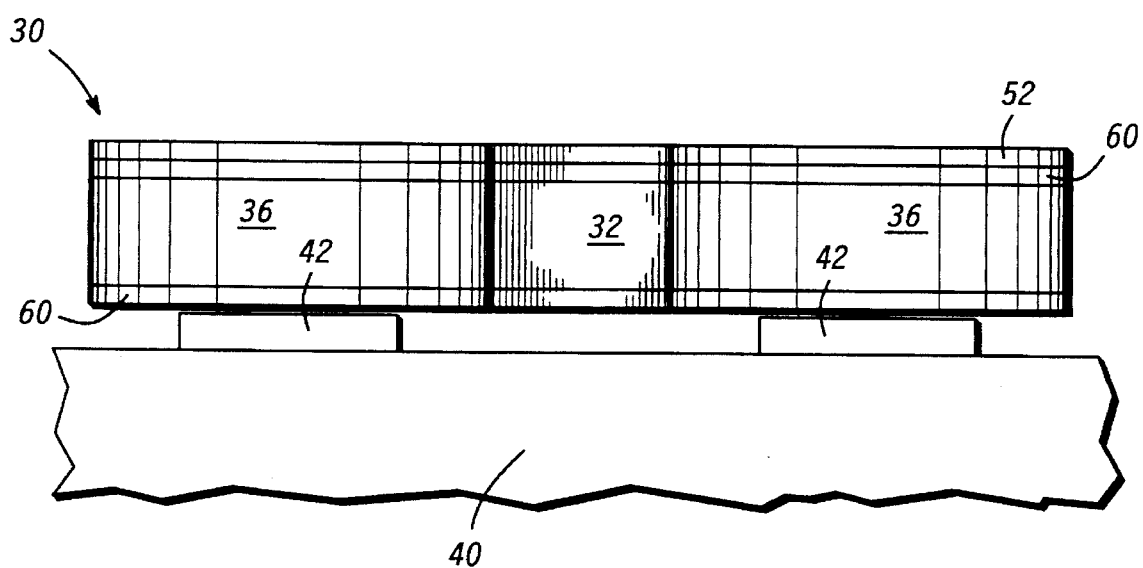
FIG. 4 shows a side-view of a preform sheet on the bond pads of a substrate in accordance with another embodiment of the present invention.

FIGS. 2-4 show a method for forming interconnect bumps of conductive material on a substrate using preform sheet 30 in accordance with the present invention.

In FIG. 2, preform sheet 30, comprised of discs 36 and ligaments 32, is arranged on a substrate 40 so that discs 36 are aligned with bond pads 42.

Substrate 40 may be comprised of a circuit board or a semiconductor substrate such as a silicon substrate or gallium arsenide substrate, among others.

In FIG. 3, preform sheet 30 is then heated by conventional methods such as by a reflow furnace or by a hot-plate, with temperatures for this heating process varying depending on the composition of preform sheet 30. Heating may be performed with or without an infrared beam. Due to surface tension, when preform sheet 30 melts, the molten metal of ligaments 32 retract into the molten metal of discs 36 and form hemispherical-shaped interconnect bumps 50 on bond pads 42 of substrate 40. Because ligaments 32 retract, each interconnect bump 50 is isolated from the other interconnect bumps 50, preventing bridging from occurring between adjacent interconnect bumps.

FIGS. 2 and 3 show a situation when bond pads 42 have a larger diameter than discs 36. This is especially common for OMPAC type packages. However, it is often the case when bonding to wafers that bond pads 42 have a smaller diameter than the diameter of discs 36. An example of this situation is shown in FIG. 4.

FIG. 4 shows a side view of preform sheet 30 arranged on bond pads 42 of substrate 40 in accordance with another embodiment of the present invention. Preform sheet 30 is comprised of a backsheet 52 for support that is adhered to the upper surface of discs 36 and ligament 32 via a thin layer of flux 50. An additional thin layer of flux 50 is provided on the lower surface of discs 36 and ligament 32 for reducing oxidation.

Preform sheet 30 is then arranged on substrate 40 so that discs 36 are aligned over bond pads 42. Backsheet 52 may then be removed either before or after the heating process described above.

Preferably, when forming interconnect bumps to bond pads 42 that have smaller diameters than discs 36, the diameter of discs 36 is approximately 1.2 to 1.8 times the diameter of bond pads 42, the length of ligaments 32 is 0.5 to 0.9 times the diameter of bond pads 42, and the preform sheet thickness is 0.2 to 0.6 times the diameter of bond pads 42.

Thus, in accordance with the present invention, a simple, reliable, and low-cost method of attaching interconnect bumps to bond pads on substrates is realized. The present invention is advantageous as it doesn't require the use of expensive robotic attachment stations that have slow cycle times. In fact, if the pitch of discs 36 is above 30 mils (0.75 mm), preform sheet 30 may be placed manually over substrate 40, as self-alignment due to surface tension of molten metal automatically aligns interconnect bumps 50 to bond pads 42. Further, the present invention provides for the formation of interconnect bumps of uniform sizes.

While the invention has been described in conjunction with several specific embodiments, it is evident to those skilled in the art that many further alternatives, modifications, and variations will be apparent in light of the foregoing description.

For example, preform sheet 30, discs 36 and ligaments 32 are not limited to solder, but may be formed of a variety of reflowable metals and alloys known in the art. Also, discs 36 do not have to be substantially circular, but may be formed in other shapes such as triangles, squares, polygons, and ellipses. Further, discs 36 may be arranged in various configurations depending on the bond pad layout and substrate and are not limited to the configurations shown in the figures.

The invention described herein is intended to embrace all of the above variations and any others that may fall within the spirit and scope of the appended claims.

What is claimed is:

1. A method for forming conductive material on bond pads on a substrate comprising the steps of:

providing a plurality of conductive discs and a connecting member with a backsheet, wherein each of said plurality of conductive discs is connected to at least another of said plurality of conductive discs by said connecting member;

placing said plurality of conductive discs over said bond pads on said substrate; and heating said plurality of conductive discs and said connecting member, wherein said backsheet is removed prior to heating, so that said plurality of conductive discs and said connecting member combine to form isolated hemispherical interconnect bumps on said bond pads.

2. The method of claim 1 wherein said step of providing a plurality of conductive discs and a connecting member is comprised of providing a plurality of conductive discs and a connecting member having a surface with a thin layer of flux formed on said surface.

3. The method of claim 1 wherein said step of providing a plurality of conductive discs and a connecting member is comprised of providing a plurality of solder discs and a connecting solder member.

4. The method of claim 1 wherein said step of providing a plurality of conductive discs and a connecting member is comprised of providing said plurality of conductive discs and said connecting member wherein said connecting member is comprised of two ends having a width and a central portion having a width, said width of said two ends being greater than said width of said central portion.

5. The method of claim 1 wherein said step of providing a plurality of conductive discs and a connecting member is comprised of providing said plurality of conductive discs and said connecting member having a thickness, said thickness being approximately 0.025 to 0.375 mm.

6. The method of claim 1 wherein said step of providing a plurality of conductive discs and a connecting member is comprised of providing said plurality of conductive discs wherein each conductive disc has a diameter, said diameter being in a range of 0.125 to 1.0 mm.

7. The method of claim 1 wherein said step of providing a plurality of conductive discs and a connecting member is comprised of providing said plurality of conductive discs, wherein one of said plurality of conductive discs has a first center and an adjacent conductive disc of said plurality of conductive discs has a second center, a distance between said first center and said second center being 0.25 to 2.5 mm.

8. The method of claim 1 wherein each conductive disc of said plurality of conductive discs has a diameter and said connecting member has a length and a width and said step of providing a plurality of conductive discs and a connecting member is comprised of providing a plurality of conductive discs and a connecting member wherein said length is approximately 0.3 to 0.7 times said diameter of each conductive disc and said width is approximately 0.1 to 0.4 times said diameter of each conductive disc.

9. The method of claim 1 wherein each conductive disc of said plurality of conductive discs has a diameter and said bond pads have a diameter and wherein said step of providing a plurality of conductive discs and a connecting member is comprised of providing a plurality of conductive discs wherein each conductive disc of said diameter is approximately 1.2 to 1.8 times larger than said diameter of said bond pads.

10. The method of claim 1 wherein said connecting member has a length and said bond pads have a diameter, and wherein said step of providing a plurality of conductive discs and a connecting member is comprised of providing said connecting member wherein said length of said connecting member is approximately 0.5 to 0.9 times said diameter of said bond pads.

11. The method of claim 1 wherein said plurality of conductive discs have a thickness and said bond pads have a diameter, and said step of providing a plurality of conductive discs and a connecting member is comprised of providing a plurality of conductive discs wherein said thickness of said plurality of conductive discs is 0.2 to 0.6 times said diameter of said bond pads.

12. The method of claim 1 wherein said substrate is a circuit board.

13. The method of claim 1 wherein said substrate is a semiconductor substrate.

14. A method for forming interconnect bumps on bond pads on a substrate comprising the steps of:

providing a preform sheet having a surface and comprised of a plurality of conductive discs, a connecting member formed between one of said plurality of conductive discs and at least another of said plurality of conductive discs;

attaching said preform sheet to a backsheet;

placing said preform sheet over said bond pads on said substrate;

removing said backsheet from said preform sheet prior to heating; and heating said preform sheet so that said plurality of conductive discs and said connecting member combine to form isolated interconnect hemispherical bumps on said bond pads.

15. The method of claim 14 wherein said step of providing a plurality of conductive discs and a connecting member is comprised of providing a said connecting member with two ends having a width and a central portion having a width, said width of said two ends being greater than said width of said central portion.

16. The method of claim 14 wherein each conductive disc of said plurality of conductive discs has a diameter and said connecting member has a length and a width and said step of providing a plurality of conductive discs and a connecting member is comprised of providing a plurality of conductive discs and a connecting member wherein said length is approximately 0.3 to 0.7 times said diameter of each conductive disc and said width is approximately 0.1 to 0.4 times said diameter.

17. The method of claim 14 wherein each conductive disc of said plurality of conductive discs has a diameter and said bond pads have a diameter and wherein said step of providing a plurality of conductive discs and a connecting member is comprised of providing said plurality of conductive discs wherein said diameter of each conductive disc of said plurality of conductive discs is approximately 1.2 to 1.8 times larger than said diameter of said bond pads.

18. The method of claim 14 wherein said connecting member has a length and said bond pads have a diameter, and wherein said step of providing a plurality of conductive discs and a connecting member is comprised of providing said connecting member wherein said length of said connecting member is approximately 0.5 to 0.9 times said diameter of said bond pads.

19. The method of claim 14 wherein said plurality of conductive discs have a thickness and said bond pads have a diameter, and said step of providing a plurality of conductive discs and a connecting member is comprised of providing said plurality of conductive discs wherein said thickness of said plurality of conductive discs is 0.2 to 0.6 times said diameter of said bond pads.

* * * * *